United States Patent
Bollenbeck et al.

(10) Patent No.: US 10,605,876 B2
(45) Date of Patent: Mar. 31, 2020

(54) LOCAL COIL WITH FREQUENCY CONVERTER

(71) Applicant: Siemens Healthcare GmbH, Erlangen (DE)

(72) Inventors: Jan Bollenbeck, Eggolsheim (DE); Ralph Oppelt, Uttenreuth (DE); Robert Rehner, Neunkirchen am Brand (DE); Markus Vester, Nürnberg (DE)

(73) Assignee: Siemens Healthcare GmbH, Erlangen (DE)

( * ) Notice: Subject to any disclaimer, the term of this patent is extended or adjusted under 35 U.S.C. 154(b) by 2 days.

(21) Appl. No.: 15/997,109

(22) Filed: Jun. 4, 2018

(65) Prior Publication Data
US 2018/0364320 A1    Dec. 20, 2018

(30) Foreign Application Priority Data

Jun. 14, 2017 (EP) .................................... 17176022

(51) Int. Cl.
*G01R 33/36* (2006.01)
*G01R 33/34* (2006.01)
*H03B 21/01* (2006.01)

(52) U.S. Cl.
CPC ... *G01R 33/3607* (2013.01); *G01R 33/34084* (2013.01); *H03B 21/01* (2013.01); *G01R 33/3635* (2013.01)

(58) Field of Classification Search
CPC .......... G01R 33/3607; G01R 33/34084; G01R 33/3635; H03B 21/01
See application file for complete search history.

(56) References Cited

U.S. PATENT DOCUMENTS

| | | |
|---|---|---|
| 8,379,549 B2 | 2/2013 | Oppelt et al. |
| 8,390,292 B2 | 3/2013 | Bollenbeck |
| 2008/0003968 A1 | 1/2008 | Li |
| 2012/0020259 A1 | 1/2012 | Bollenbeck et al. |
| 2017/0293003 A1* | 10/2017 | Twieg ................ G01R 33/3621 |

FOREIGN PATENT DOCUMENTS

| | | |
|---|---|---|
| DE | 102008062855 A1 | 7/2010 |
| DE | 102009008623 B3 | 12/2010 |
| DE | 102010027672 A1 | 1/2012 |

OTHER PUBLICATIONS

European Search Report dated Nov. 24, 2017 for related EP Application No. 17176022.6.

* cited by examiner

*Primary Examiner* — Patrick Assouad
*Assistant Examiner* — Haidong Zhang
(74) *Attorney, Agent, or Firm* — Lempia Summerfield Katz LLC

(57) ABSTRACT

The disclosure relates to a local coil with a device for providing a first mixed frequency signal and a second mixed frequency signal by a first auxiliary frequency signal and a second auxiliary frequency signal. The device has an auxiliary mixer configured to generate the second mixed frequency signal from the first auxiliary frequency signal and the second auxiliary frequency signal. The local coil has a signal input including a first signal connection to the device. The local coil is configured to jointly receive the first auxiliary frequency signal and the second auxiliary frequency signal by way of the signal input and supply them to the device by way of the first signal connection.

10 Claims, 2 Drawing Sheets

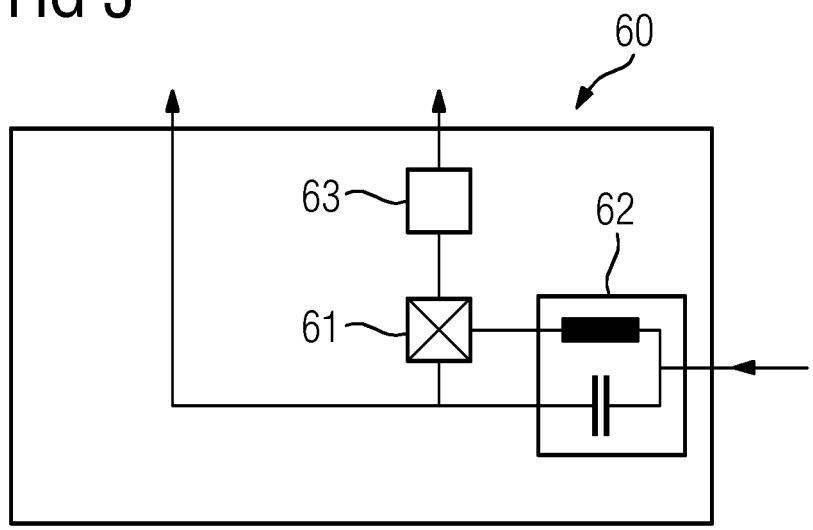
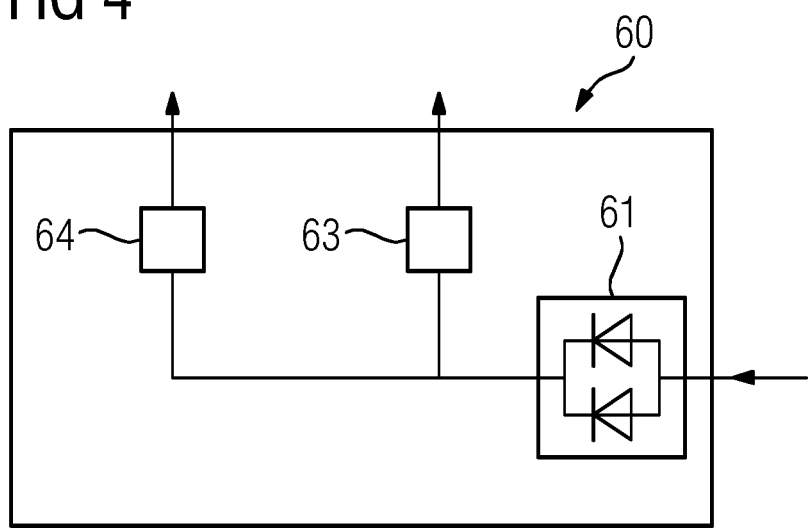

LOCAL COIL WITH FREQUENCY CONVERTER

The application claims the benefit of European Patent Application No. EP 17176022.6, filed Jun. 14, 2017, which is hereby incorporated by reference in its entirety.

TECHNICAL FIELD

The disclosure relates to a local coil and a magnetic resonance scanner with a local coil. The local coil has a device for providing a first mixed frequency signal and a second mixed frequency signal by a first auxiliary frequency signal and a second auxiliary frequency signal.

BACKGROUND

Magnetic resonance scanners are imaging devices which, in order to image an investigated object, align nuclear spins of the investigated object with a strong external magnetic field and stimulate this alignment by a magnetic alternating field for precession. The precession and/or return of the spin from this stimulated state into a state with lower energy in turn generates an alternating magnetic field in response, which is received by way of antennae.

With the aid of magnetic gradient fields, spatial encoding is imprinted on the signals, subsequently enabling an assignment of the received signal to a volume element. The received signal is then evaluated and three-dimensional imaging of the investigated object provided. Local antennae, so-called local coils, which are arranged directly on the investigated object to obtain a better signal to noise ratio, may be used to receive the signal.

To reduce the number of cable connections between the local coil and the magnetic resonance scanner, the signals of several antenna coils may be jointly transmitted by frequency-division multiplexing. Implementation by mixers on various carrier frequencies, also referred to as intermediate frequencies, is required for this. As the frequency and the phase of the signals are of major importance for imaging with magnetic resonance signals, it is also necessary to obtain these variables when transmitting with frequency-division multiplexing. The auxiliary signals for mixing are therefore customarily generated centrally in the magnetic resonance scanner with a high degree of precision and then distributed to the local coils.

German Patent Publication No. DE 10 2008 062 855 A1 describes a system in which a multiplicity of signals is spectrally separated from one another from a base system to a satellite and in the reverse direction and by a bandpass filter bank in each case.

A magnetic resonance scanner is known from German Patent Publication No. DE 10 2009 008 623 A1, for example, in which mixed frequency signals are supplied for frequency-division multiplexing by way of separate cables.

In systems with lower magnetic fields, the Larmor frequencies are lower, such that the frequency schemes of the high field systems may no longer be used to avoid interference by the intermediate frequencies.

SUMMARY AND DESCRIPTION

It is an object of the present disclosure to provide a device which permits a more flexible choice of frequency.

The scope of the present disclosure is defined solely by the appended claims and is not affected to any degree by the statements within this description. The present embodiments may obviate one or more of the drawbacks or limitations in the related art.

The local coil has a device for providing a first mixed frequency signal and a second mixed frequency signal by a first auxiliary frequency signal and a second auxiliary frequency signal. The first auxiliary frequency signal and the second auxiliary frequency signal have different frequencies in the sense that at least the signal components with the largest amplitudes differ in frequency. The first auxiliary frequency signal and the second auxiliary frequency signal, for example, are provided by a frequency generator of a magnetic resonance scanner. At most, the frequency of the first mixed frequency signal is equal to a frequency of the first auxiliary frequency signal or the second auxiliary frequency signal. In other words, at least one mixed frequency signal of the two mixed frequency signals is not supplied directly to the device but derived from mixing of the first auxiliary frequency signal and the second auxiliary frequency signal. Mixing is understood to refer to signal processing which produces intermodulation products of the first and/or second auxiliary frequency signal. This may be achieved analogously by non-linear characteristics, for example, by diodes or amplifier elements. In digital signal processing, for example, multiplication, potential or exponential functions or also binary functions such as AND and/or OR functions are conceivable for generating intermodulation products. The functional unit which performs the mixing of the first and the second auxiliary frequency and/or of signals derived thereof, is hereinafter referred to as an auxiliary mixer.

The device has such an auxiliary mixer configured to produce the second mixed frequency signal from the first auxiliary frequency signal and the second auxiliary frequency signal. It is furthermore also conceivable that the first mixed frequency signal is likewise generated by the auxiliary mixer or a further auxiliary mixer from the first auxiliary frequency signal and the second auxiliary frequency signal, wherein the frequency of the first mixed frequency signal is not equal to a frequency of the first auxiliary frequency signal and the second auxiliary frequency signal and the second mixed frequency signal. However, it just as conceivable that the frequency of the first mixed frequency signal is equal to the frequency of the first auxiliary frequency signal or the second auxiliary frequency signal.

The local coil has a signal input which has a first signal connection with the device. The local coil is configured to receive the first auxiliary frequency signal and the second auxiliary frequency signal jointly by way of the signal input and supply them to the device by way of the first signal connection.

It advantageously enables the device to generate two different mixing frequencies from two auxiliary frequency signals supplied by way of a common signal input, and thus to decouple the selection of the frequencies of the auxiliary frequency signals from the selection of the frequencies of the mixed frequency signals by at least one degree of freedom and render this more flexible.

The magnetic resonance scanner shares the advantages of the local coil.

In a conceivable embodiment of the local coil, the device has a first diplexer. The first diplexer has a signal connection with the auxiliary mixer by way of a second signal connection and a third signal connection.

The first diplexer is configured to separate the first auxiliary frequency signal and the second auxiliary frequency signal supplied jointly by way of the first signal connection and to supply them to the auxiliary mixer separately by way of the second signal connection and the third signal connection. For example, the first auxiliary frequency signal may be separated from the second auxiliary frequency signal by a high pass and/or a low pass and/or bandpasses as filters and then by way of the second signal connection the first auxiliary frequency signal, and by way of the second auxiliary frequency signal the third signal connection, supplied separately to the auxiliary mixer. The filters can, for example, be provided by passive LC circuits, active LC or RC filters or in digital signal processing by corresponding circuitry and/or algorithms in a signal processing resource such as a signal processor or FPGA.

The separation of the first auxiliary frequency signal from the second auxiliary frequency signal permits the use of advantageous circuitry in the subsequent auxiliary mixer. For example, in a ring mixer the original first auxiliary frequency signal and the second auxiliary frequency signal may be suppressed with respect to the first mixed frequency signal and the second mixed frequency signal.

In a conceivable embodiment of the device, the auxiliary mixer is configured to generate the second mixed frequency signal by third-order intermodulation.

Third-order intermodulation may be provided advantageously by simple diode distortion, e.g., a single diode or an antiparallel pair of diodes which also outputs the original auxiliary frequency signals for a further use at the signal output.

In a possible embodiment of the local coil, the device has a bandpass filter having a fourth signal connection to a first signal output of the auxiliary mixer. The bandpass filter is configured to filter the second mixed frequency signal from an output signal of the auxiliary mixer. For example, the output signal of the auxiliary mixer may still have components of the first auxiliary frequency signal and/or the second auxiliary frequency signal or mixed products of a higher order which are removed by the bandpass filter.

The bandpass filter advantageously enables the use of a simple frequency scheme and/or auxiliary mixer as undesirable frequencies are subsequently filtered out by the bandpass filter.

In a conceivable embodiment of the local coil, the auxiliary mixer has diode distortion.

Diode distortion is a particularly easy and inexpensive way of producing higher-order intermodulation products.

In a possible embodiment of the magnetic resonance scanner, the magnetic resonance scanner has a receiver with a signal input. The receiver is configured to receive and evaluate received signals with the frequency of a mixed signal from a magnetic resonance signal with a Larmor frequency and a first mixed frequency signal and/or a second mixed frequency signal at the signal input.

Advantageously, the magnetic resonance scanner may evaluate the magnetic resonance signals generated by the auxiliary frequencies and transmitted in frequency-division multiplexing by way of a shared line.

BRIEF DESCRIPTION OF THE DRAWINGS

The properties, features, and advantages of this disclosure described above and the way in which these are achieved become clearer and more readily comprehensible in the context of the following description of the exemplary embodiments, which are explained in more detail with reference to the drawings.

FIG. 3 depicts a schematic view of a local oscillator of an embodiment of a local coil.

FIG. 4 depicts a schematic view of a local oscillator of an embodiment of a local coil.

DETAILED DESCRIPTION

Figure 1:
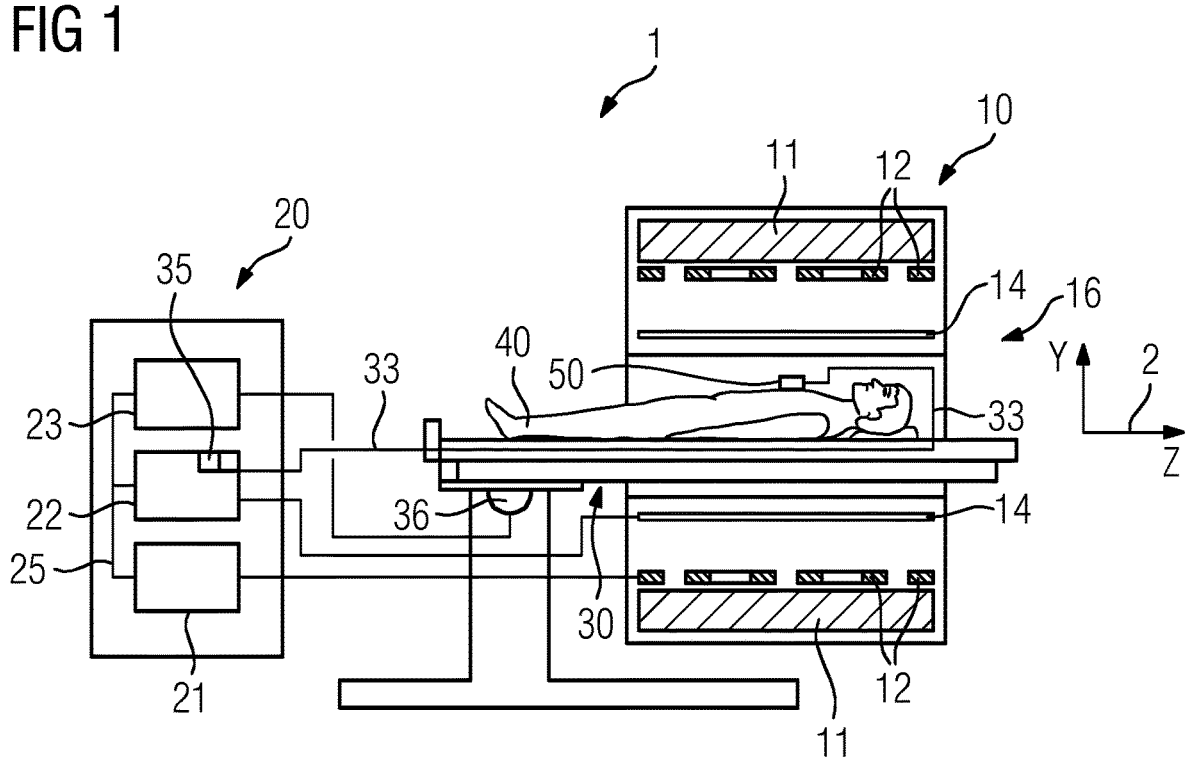
FIG. 1 depicts a schematic view of a magnetic resonance scanner with an exemplary local coil.

FIG. 1 depicts a schematic view of an embodiment of a magnetic resonance scanner 1.

The magnet unit 10 has a field magnet 11 which creates a static magnetic field B0 for aligning nuclear spins of samples and/or patients 40 in a recording area. The recording area is arranged in a patient tunnel 16 which extends in a longitudinal direction 2 through the magnet unit 10 and may be moved by the traversing unit 36. The field magnet 11 may be a superconducting magnet that may provide magnetic fields with a magnetic flux density of up to 3 T, or even more in the latest devices. For lower field strengths, however, permanent magnets or electromagnets with normally conductive coils may also be used.

Furthermore, the magnet unit 10 has gradient coils 12 configured to superimpose variable magnetic fields on the magnetic field B0 in three spatial directions to spatially differentiate the recorded imaging regions in the volume of investigation. The gradient coils 12 may include coils of normally conductive wires which may generate fields orthogonal to each other in the volume of investigation.

The magnet unit 10 also has a body coil 14 configured to emit a high-frequency signal supplied by way of a signal line into the volume of investigation and to receive resonance signals emitted by the patient 40 and emit them by way of a signal line. However, for receiving high-frequency signals, the body coil 14 may be replaced by local coils 50 arranged in the patient tunnel 16 close to the patient 40. However, it is also conceivable that the local coil 50 is configured for transmission and reception.

A control unit 20 supplies the magnet unit 10 with the various signals for the gradient coils 12 and the body coil 14 and evaluates the received signals.

The control unit 20 thus has a gradient control 21 configured to supply the gradient coils 12 by way of leads with variable currents which provide the desired gradient fields in the volume of investigation in a chronologically coordinated manner.

Furthermore, the control unit 20 has a high-frequency unit 22 configured to produce a high-frequency pulse with a predetermined chronological sequence, amplitude and spectral power distribution to stimulate a magnetic resonance of the nuclear spin in the patient 40. Pulse outputs in the range of kilowatts may be achieved in the process.

Furthermore, the high-frequency unit 22 has a frequency generator 35 configured to generate a first auxiliary frequency signal and a second auxiliary frequency signal for the local coil, as explained hereinafter, and to transmit these to the local coil 50 by way of the signal connection 33.

Figure 2:
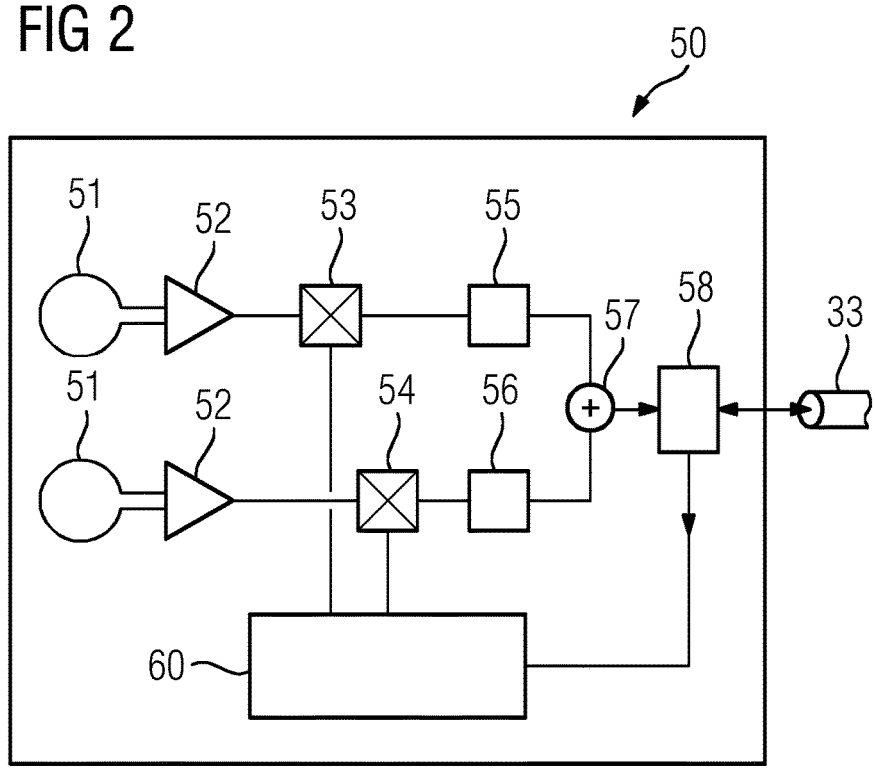
FIG. 2 depicts a schematic view of an embodiment of a local coil.

FIG. 2 provides a schematic overview of a local coil.

The antenna coils 51 receive magnetic resonance signals from the body of the patient 40. The two antenna coils 51 may cover different spatial regions. The weak magnetic resonance signals are first amplified by a Low Noise Amplifier 52 (LNA). The signals are converted to different intermediate frequencies ZF1 and ZF2 for transmission by frequency-division multiplexing on a shared line from a first mixer 53 and a second mixer 54 so that they may be evaluated separately. As explained hereinafter for FIG. 3 and FIG. 4, the mixed frequency signals for the first mixer 53 and the second mixer 54 are provided by the local oscillator 60. Ring mixers, (e.g., push-pull mixers), are configured as mixers 52, 54 or as simple diode mixers. A version in digital signal processing, e.g., as multipliers or AND gates, is also conceivable.

The output signals of the first mixer 53 and the second mixer 54 may be spectrally cleaned by a first filter 55 and a second filter 56 to suppress unwanted mixed products, e.g., undesired frequency components are attenuated by 6 dB, 12 dB or more vis-à-vis desired signals. The first filter 55 and the second filter 56, for example, may each be bandpasses with the center frequency ZF1 and/or ZF2. The first filter 55 and the second filter 56 may be configured as passive or active LC and/or RC filters, executed by other analog filter techniques such as quartz or surface acoustic wave filters or also by digital signal processing.

The filtered output signals of the first mixer 53 and the second mixer 54 are merged, for example, by a summing element 57 in the form of two resistors and output on the shared signal connection 33 by way of a second diplexer 58. Bandpass or high and low pass filters may serve as a second diplexer 58 for the auxiliary frequency signals and the intermediate frequency signals at different frequency bands, but other technologies such as, for example, a gyrator for merging and/or separating the incoming and outgoing signals are also conceivable.

FIG. 3 depicts an exemplary embodiment of a local oscillator 60. In the embodiment of FIG. 3, the first auxiliary frequency signal and the second auxiliary frequency signal are jointly supplied to the first diplexer 62 by way of a first signal connection which separates the first auxiliary frequency signal from the second auxiliary frequency signal and provides them separately to the second signal connection and a third signal connection. Separation is understood to mean that the respective undesired signal is attenuated by 6 dB, 12 dB, 18 dB, or more vis-à-vis the desired signal.

In the embodiment shown in FIG. 3, the first mixed frequency signal supplied to the first mixer 53 is the same as the first auxiliary frequency signal, (e.g., the frequency position and/or the center frequency is the same and the levels are only slightly altered by the frequency response of the first diplexer 62 and the second diplexer 58 compared with that supplied by the signal connection 33 by way of the signal input).

The second mixed frequency signal is generated by the auxiliary mixer 61 from the first auxiliary frequency signal and the second auxiliary frequency signal and the subsequent filter 63 by mixing. The first auxiliary mixer may have a design in which the originally supplied first auxiliary frequency signal and the second auxiliary frequency signal is suppressed by 6 dB, 12 dB or more in the second mixed frequency signal. For example, the auxiliary mixer may be configured as a ring mixer or a push-pull mixer. Through the suppression of the original auxiliary frequency signals in the auxiliary mixer the filter 63 may be configured more simply, for example, as a simple low pass.

In an embodiment of FIG. 3, for example, 35 MHz and 50 MHz may be selected as frequencies of the auxiliary frequency signals and 35 MHz as a frequency of the first mixed frequency signal and 15 MHz as a frequency of the second mixed frequency signal.

FIG. 4 depicts another possible embodiment of the local oscillator 60. In this embodiment, a first diplexer 62 is not required, but the first auxiliary frequency signal and the second auxiliary frequency signal are supplied to the auxiliary mixer 61 by way of a shared signal connection. In this embodiment, a non-linear element is conceivable as an auxiliary mixer 61, for example, one or even two antiparallel diodes. Other non-linear amplifier elements such as transistors are also possible in the non-linear characteristic range. Such non-linear mixers not only generate second-order mixed signals with a frequency corresponding in each case to the total and/or the difference of the frequencies of the first auxiliary frequency signal and the second auxiliary frequency at the signal output, but higher-order mixed products are also produced. Furthermore, the first auxiliary frequency signal and the second auxiliary frequency signal are also found at the signal output of the auxiliary mixer 61 with a comparable level.

In the embodiment of FIG. 4, the local oscillator therefore also has filters 63, 64 with which the desired first mixed frequency signal and the desired second mixed frequency signal are filtered out of the output signal of the auxiliary mixer 61. The aforementioned analog or digital filter technologies may also be used as filters.

The additionally generated higher-order mixed products require more effort in filtering but permit the use of less expensive mixer technologies and through the additional mixed products, they provide additional degrees of freedom when selecting the frequencies of the auxiliary frequency signals, the mixed frequency signals and the intermediate frequencies.

In an embodiment of FIG. 4, for example, 35 MHz and 55 MHz may be selected as frequencies of the auxiliary frequency signals and 35 MHz as the frequency of the first mixed frequency signal and 15 MHz as the frequency of the second mixed frequency signal.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local coil with a device for providing a first mixed frequency signal and a second mixed frequency signal by a first auxiliary frequency signal and a second auxiliary frequency signal, the local coil comprising:
    a first signal connection;
    an auxiliary mixer configured to generate the second mixed frequency signal from the first auxiliary frequency signal and the second auxiliary frequency signal, wherein the auxiliary mixer is a non-linear mixer, and wherein the second mixed frequency signal is a higher-order mixed signal having a different frequency from a frequency of the first auxiliary frequency signal and a frequency of the second auxiliary frequency signal; and a signal input connected to the first signal connection,
wherein the local coil is configured to receive the first auxiliary frequency signal and the second auxiliary frequency signal jointly by way of the signal input and supply the first auxiliary frequency signal and the second auxiliary frequency signal to the device by way of the first signal connection, and
wherein a frequency of the first mixed frequency signal is equal to the frequency of the first auxiliary frequency signal or the frequency of the second auxiliary frequency signal.

2. The local coil of claim 1, wherein the auxiliary mixer is configured to generate the second mixed frequency signal by third-order intermodulation.

3. The local coil of claim 2, further comprising:
a bandpass filter having a fourth signal connection to a first signal output of the auxiliary mixer, wherein the bandpass filter is configured to filter the second mixed frequency signal out of an output signal of the auxiliary mixer.

4. The local coil of claim 3, wherein the auxiliary mixer has diode distortion.

5. The local coil of claim 2, wherein the auxiliary mixer has diode distortion.

6. The local coil of claim 1, further comprising:
a bandpass filter configured to filter the second mixed frequency signal out of an output signal of the auxiliary mixer.

7. The local coil of claim 6, wherein the auxiliary mixer has diode distortion.

8. A magnetic resonance scanner comprising:
a frequency generator; and
a local coil configured to provide a first mixed frequency signal and a second mixed frequency signal by a first auxiliary frequency signal and a second auxiliary frequency signal, the local coil comprising:
a first signal connection;
an auxiliary mixer configured to generate the second mixed frequency signal from the first auxiliary frequency signal and the second auxiliary frequency signal, wherein the auxiliary mixer has diode distortion; and
a signal input connected to the first signal connection,
wherein the local coil is configured to receive the first auxiliary frequency signal and the second auxiliary frequency signal jointly by way of the signal input and supply the first auxiliary frequency signal and the second auxiliary frequency signal by way of the first signal connection, and wherein a frequency of the first mixed frequency signal is equal to a frequency of the first auxiliary frequency signal or a frequency of the second auxiliary frequency signal,
wherein the magnetic resonance scanner is configured to provide the first auxiliary frequency signal and the second auxiliary frequency signal at a second signal output.

9. The magnetic resonance scanner of claim 8, wherein the magnetic resonance scanner further comprises:
a receiver having a receiver signal input,
wherein the receiver is configured to receive and evaluate received signals with a frequency of a mixed signal from a magnetic resonance signal with a Larmor frequency and one or more of the first mixed frequency signal and the second mixed frequency signal at the receiver signal input.

10. A local coil with a device for providing a first mixed frequency signal and a second mixed frequency signal by a first auxiliary frequency signal and a second auxiliary frequency signal, the local coil comprising:
a first signal connection;
an auxiliary mixer configured to generate the second mixed frequency signal from the first auxiliary frequency signal and the second auxiliary frequency signal;
a signal input connected to the first signal connection; and
a first diplexer, a second signal connection, and a third signal connection between the first diplexer and the auxiliary mixer,
wherein the local coil is configured to receive the first auxiliary frequency signal and the second auxiliary frequency signal jointly by way of the signal input and supply the first auxiliary frequency signal and the second auxiliary frequency signal to the device by way of the first signal connection,
wherein a frequency of the first mixed frequency signal is equal to a frequency of the first auxiliary frequency signal or a frequency of the second auxiliary frequency signal, and
wherein the first diplexer is configured to separate the first auxiliary frequency signal and the second auxiliary frequency signal jointly supplied by way of the first signal connection and supply the first auxiliary frequency signal and the second auxiliary frequency signal separately to the auxiliary mixer by way of the second signal connection and the third signal connection.

* * * * *